(12) United States Patent
Ivanov

(10) Patent No.: US 8,575,948 B2
(45) Date of Patent: Nov. 5, 2013

(54) TOUCH AND APPROACH DETECTION WITH CAPACITATIVE SENSORS

(75) Inventor: Artem Ivanov, Gilching (DE)

(73) Assignee: Ident Technology AG, Wessling (DE)

(*) Notice: Subject to any disclaimer, the term of this patent is extended or adjusted under 35 U.S.C. 154(b) by 96 days.

(21) Appl. No.: 12/529,426

(22) PCT Filed: Jul. 3, 2009

(86) PCT No.: PCT/EP2009/058466
§ 371 (c)(1),
(2), (4) Date: Sep. 22, 2011

(87) PCT Pub. No.: WO2010/000862
PCT Pub. Date: Jan. 7, 2010

(65) Prior Publication Data
US 2012/0001647 A1    Jan. 5, 2012

(30) Foreign Application Priority Data
Jul. 4, 2008   (DE) .......................... 10 2008 031 743

(51) Int. Cl.
*G01R 27/26*   (2006.01)
(52) U.S. Cl.
USPC ........................... 324/682; 324/658; 324/690

(58) Field of Classification Search
USPC .................................................. 324/654–690
See application file for complete search history.

(56) References Cited

U.S. PATENT DOCUMENTS 5,150,062 A * 9/1992 Takeuchi ...................... 324/675
2002/0154039 A1 10/2002 Lambert
2009/0219039 A1  9/2009 Fasshauer

FOREIGN PATENT DOCUMENTS

DE   102005003488    *  2/2006
DE   102005003488 A1   3/2006
WO   2009153332 A2    12/2009

* cited by examiner

*Primary Examiner* — Huy Q Phan
*Assistant Examiner* — Farhana Hoque
(74) *Attorney, Agent, or Firm* — King & Spalding L.L.P.

(57) ABSTRACT

Provided by the invention is a sensor device for the detection of touch or approach of an object. A server circuit of the sensor device according to the invention is formed in such a manner, that the server circuit alone (i.e. without co-operation with a client circuit) may be used as approaching sensor, at the same time however also together with one or several client circuits may be implemented a sensor network, in which the client circuits preferably are fed with energy with the electric field of the server electrode.

16 Claims, 3 Drawing Sheets

TOUCH AND APPROACH DETECTION WITH CAPACITATIVE SENSORS

CROSS REFERENCE TO RELATED APPLICATIONS

Figure 1:
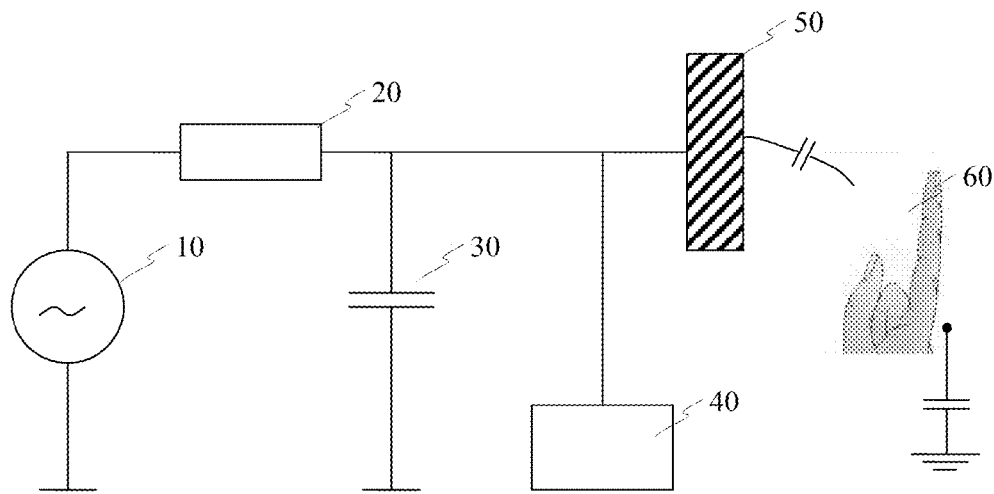

This application is the US national phase of PCT application PCT/EP2009/058466, filed 3 Jul. 2009 and claiming the priority of German patent application 102008031743.8 itself filed 4 Jul. 2008, whose entire disclosures are herewith incorporated by reference.

The invention relates to a sensor device for detection of an approach of an object in an observation area supervised by the sensor device.

The invention is based on the objective to show solutions by which the approach of objects, especially of persons and animals, can be captured or detected reliably in the above-described observation area.

Thus, according to the invention, a sensor device is provided for detection of an approach of an object in an observation area supervised by the sensor device, whereby the sensor device comprises a server circuit, with
    an LC-oscillating circuit with a signal transducer circuit, preferably an LC-oscillating circuit having a high quality factor, for the generation of an electric field,
    an electrode device coupled with the LC-oscillating circuit, wherein the capacitance of the electrode device constitutes a component of the oscillating circuit capacitance and in which the electric field generated by the LC-oscillating circuit at the electrode device may be radiated into the observation area, and
    an evaluating device,
    whereby the approach of an object, especially of a person or animal, causes a change of the capacitive environment of the electrode device in the observation area of the electrode device, which is detectable by the evaluating device.

Preferably the signal transducer circuit is formed as oscillator and the LC-oscillating circuit as series LC-oscillating circuit, in which the electrode device is connected in parallel to the LC-oscillating circuit. The oscillator and the series LC-oscillating circuit may constitute a free-running LC-oscillator.

The LC-oscillating circuit may be also formed as parallel LC-oscillating circuit, whereby the electrode device is connected in series to the LC-oscillating circuit.

Further embodiments of the LC-oscillating circuit and of the arrangement of the electrode device relative to the LC-oscillating circuit are possible.

The series LC-oscillating circuit having a high quality factor leads to an effective increase of the voltage amplitude at the electrode device, as well as to an increased sensitivity for load modulation at this electrode device. The high quality factor of the series LC-oscillating circuit at the same time leads to generating a very stable frequency, which depends on the values of inductance and capacitance in the oscillating circuit.

The sensor device is preferably operated so that the change of the capacitive environment of the electrode device causes a frequency change of the (free-running) LC-oscillator, in which the frequency change is detectable by the evaluating device. The approach of an object in the observation area of the electrode device thus leads to a change of the capacitive environment of this electrode device, which leads again to a frequency change of the oscillator. By the approach of an object thus the oscillator signal becomes frequency-modulated and this frequency modulation being detectable by the evaluating device.

The signal transducer circuit may be also designed as generator. Preferably the generator is then operated in resonance to the LC-oscillating circuit, which has the advantage, that also particularly small capacitance variations, for example capacitance variations of 1 pF or smaller, are detectable at the electrode device. In this case, the modification of capacitance on the electrode device is detected on the basis of signal phase shifting by the evaluating device.

The server circuit advantageously may be operated also in connection with at least one client circuit. For this purpose the sensor device moreover presents at least one client circuit, with
    a second electrode device, comprising at least one first electrode and at least one second electrode, and
    a modulation device coupled with the second electrode device, in which the electric field radiated from the electrode device of the server circuit may be coupled on the first electrode of the second electrode device, the coupled electric field being modulatable by means of the modulation device, in which the modulated signal may be fed back to the server circuit via the electrode device of the server circuit, preferably by means of load modulation, and the fed back signal being detectable and evalutable by the evaluation device.

Thus, in an advantageous embodiment of the invention, a sensor device is provided, which allows detecting approach of an object to the electrode device of the server circuit in case of simultaneous modulation by the client circuit of the signal radiated by the electrode device of the server circuit, whereby, apart from the frequency modulation, also the modulation by the client circuit is detectable by the evaluation device.

The approach of an object to the second electrode of the second electrode device may cause a modulation of the coupled electric field via the modulation device. So the evaluating device may detect in addition to the approach of an object to the electrode device of the server circuit also the approach of an object to the second electrode of the client circuit. The evaluating device may detect also the approach of an object at the second electrode of the client circuit, e.g. the approach of a fluff filter in a laundry drier.

The first electrode may be formed likewise by the electrode device of the server circuit, so that a capacitive coupling of the electric field of the first electrode of the second electrode device is not necessary. Also in this embodiment the approach of an object to the second electrode of the second electrode device causes a modulation of the electric field generated by the electrode device of the server circuit.

The coupling of the electric field on the first electrode of the client circuit may take place by bridging, whereby the bridging causes a modulation of the coupled electric field by the modulation device. Due to the bridging effect the client circuit in reference to the server circuit may be arranged in such a manner, that the approach of an object, especially of a person or animal, is detectable in the area between the electrode device of the server circuit and the first electrode of the client circuit. In case of such an arrangement of the client circuit opposite to the server circuit the second electrode of the client circuit preferably is coupled with mass.

With the coupled electric field the client circuit may be also fed with energy, so that a client circuit without internal power supply nay be realized, which is especially advantageous in regard to the size and to the application field.

The modulation device preferably is formed in such a way that the coupled electric field is amplitude-modulated, whereby the amplitude change is detectable by the evaluating device.

Preferably the approach of an object in the observation area of the electrode device of the server circuit is detectable, whereby the approach of the object to the second electrode of the second electrode device is also detectable.

Particularly preferably the approach of an object is detectable in the observation area of the electrode device of the server circuit before the approach of the object to the second electrode of the second electrode device. In this way it is achieved that the approach of an object to the sensor device is detected before the approach of the object to the client circuit is recognized.

Figure 2:
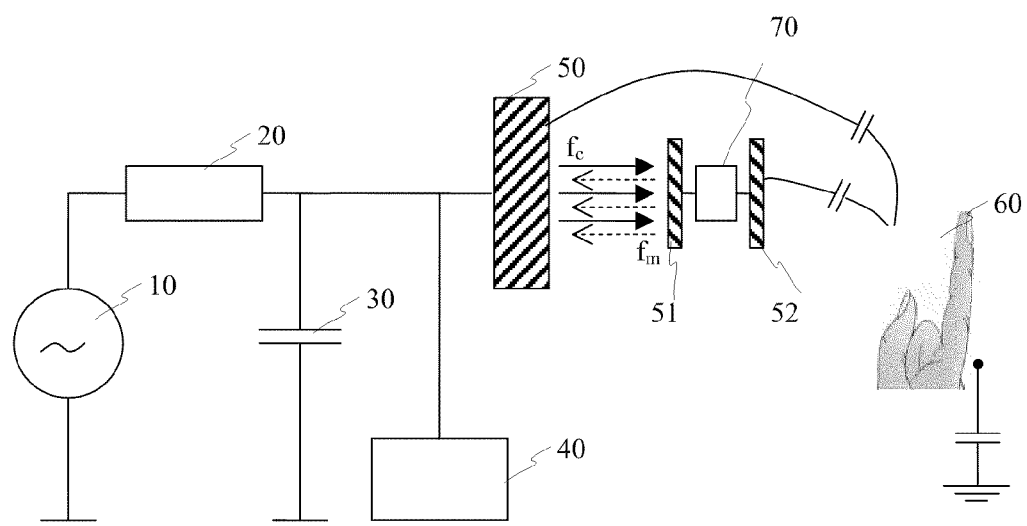
Figure 3:
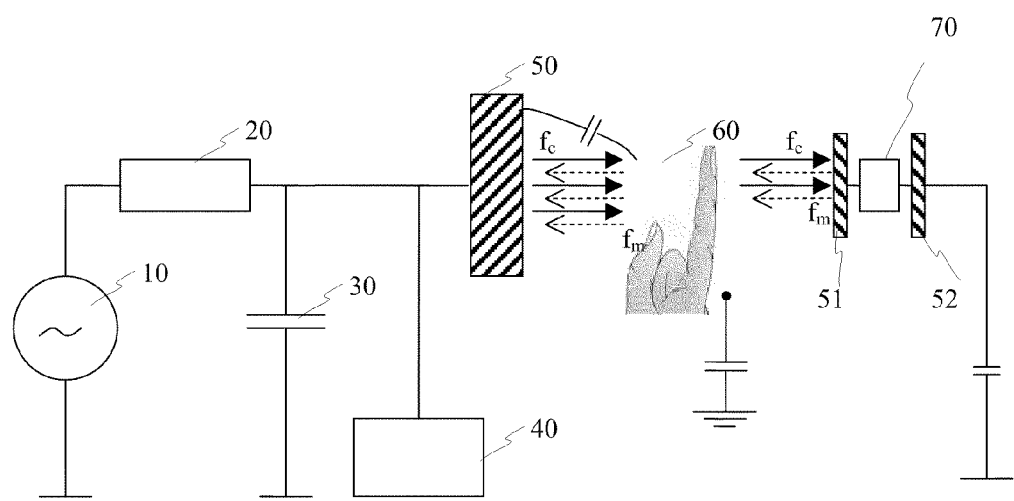

Further details and features of the invention result from the following description in connection with the drawing. The figures show:

FIG. 1 a basic set-up of a circuit diagram of a server circuit of the sensor device according to the invention for the illustration of the operating mode of the server circuit, FIG. 2 a basic set-up of a circuit diagram of a sensor device according to the invention, which comprises a server circuit and a client circuit, wherein a first approaching variant of an object to the sensor device is shown; and FIG. 3 a basic set-up of a circuit diagram of a sensor device according to the invention, with a server circuit and a client circuit, in which another variant of approaching of an object to the sensor device is shown.

FIG. 1 shows a basic circuit of a server circuit of the sensor device according to the invention. The server circuit substantially consists of a generator 10 and a series LC-oscillating circuit formed by the inductance 20 and by the capacitance 30. The generator 10, the inductance 20 and the capacitance 30 may form a free-running LC-oscillator. Parallel to the series LC-oscillating circuit there is a server electrode 50, as well as an evaluating device 40.

The generator 10 of the server circuit generates first an alternating voltage, which is conducted to the series LC-oscillating circuit 20, 30, in order to increase the level of the signal, in order to then generate an electric field with sufficiently range. The generated electric field is emitted from an electrode 50, whereby the electric field emitted from the electrode 50 defines the observation area to be observed by the server circuit.

The LC-oscillating circuit is preferably an oscillating circuit having a high quality factor. The main objective of it is an effective increase of the voltage amplitude on the electrode 50 as well as a sensitivity increase of the load modulation at this electrode.

Since the capacitance of the server electrode 50 is parallel to the oscillator circuit capacitance 30, the oscillator frequency varies with the capacitive environment change of the server electrode 50. The modification of the electrode capacitance of the electrode 50 ordinarily lies in the range between 1 to 100 pF. Such a change leads to a relevant oscillator frequency change, for example to a change between 0.1 and 10 kHz.

The evaluating device is formed in such a manner, that it can detect the modification of the oscillator frequency and thus recognize the approach of an object 60, especially of a person or animal, to the electrode 50. The approach of a person or animal 60 is illustrated in FIG. 1 schematically by a hand, wherein by approaching to the server electrode 50, the field radiated by the same is partially absorbed by the object 60, which leads to a modification of the capacitive environment of the server electrode 50.

The evaluating device 40 may be arranged e.g. in such a way that it compares the frequency change of the signal generated by the LC-oscillator with a reference signal, which is generated for example by a quartz stabilized oscillator. Comparing the oscillator signal frequency with the reference signal frequency can take place with different means known from prior art. The quartz-stabilized oscillator in addition may be used also as a clock pulse for a counter, whereby the counter measures the frequency of the oscillator signal within a pre-determined number of cycles. With temporally sequential measurements within several time intervals of equal cycle length it can be determined whether the frequency of the oscillator signal changes or not.

Due to the structure according to the invention of the server circuit with a generator and a series LC-oscillating circuit the temperature-dependent frequency changes of the server circuit can be recognized efficiently, since the magnitude of a temperature-dependent modification of the oscillator frequency because of the large time constant of a temperature change is much smaller than a modification due to the approach of an object to the server electrode 50.

The inductance 20 and the capacitance 30 also may be excited by a generator 10 with fixed frequency, the detection of approach taking place in this case on the basis of the signal phase shifting. Particularly advantageous is when the generator 10 is operated in resonance to the LC-oscillating circuit.

The server circuit according to the invention allows, that particularly small capacitance variations of for example 1 pF or smaller are detected within a very short time, for example within 10 ms directly by the server circuit respectively the evaluating device. Longer measuring intervals allow moreover also the detection of very small frequency changes caused by the capacitance variation on the electrode.

FIG. 2 shows a further advantageous embodiment of a sensor device according to the invention. The server circuit is built as shown in FIG. 1. Additionally the sensor device presents a client circuit. The client circuit substantially consists of an electrode device with two electrodes 51 and 52 as well as a modulation device 70, in which the electrodes 51, 52 each are coupled with the modulation device 70.

The electric field fc generated by the server circuit and emitted at the server electrode 51 is coupled to the first electrode of the client circuit. This coupled field can be used at the same time also in order to supply energy to the client circuit. The coupled electric field fc is modulated by the modulation device 70. The modulated signal fm is fed back to the server circuit via the server electrode 50, preferably by means of load modulation, where it is led to the evaluating device 40.

The signal modulation undertaken by the modulation device 70 of the client circuit is evaluated by the evaluating device 40. The electric field is amplitude-modulated by the client circuit or by the modulation device 70.

If an object approaches the second electrode 52, as shown in FIG. 2, this leads to a change of the level of the modulation device, which leads to a varied amplitude of the modulated electric field. This changed amplitude is detected and evaluated by the evaluating device 40.

At the same time an object approach to the client circuit can lead to the object absorbing also a part of the electric field irradiated from the server electrode 50. The absorption of the electric field leads to a change of the frequency of the signal radiated from the server electrode 50, as already described under FIG. 1. In this case both a frequency modulated signal and an amplitude modulated signal are supplied to the evaluating device 40. Thus both an object approach to the server electrode 50 and also one to electrode 52 of the client circuit are detectable.

With an adequate arrangement of the client circuit as to the server electrode 50 an object approach to the server electrode 50 can be recognized even before the approach of an object to the client circuit is recognized.

This can be used advantageously for example in case of a control panel of an apparatus, e.g. for a washing machine. If the control panel of an apparatus presents several client circuits, in which a special action can be assigned to every client circuit, and in which one part of the control panel is formed as a server electrode 50, the approach of a hand to the control panel can be detected still before it is used, i.e. before the approach of the hand to the client circuit. The early recognition of an approach of an object to the server circuit or to the server electrode 50 has the particular advantage, that for example necessary initialization measures already can be realized before the hand reaches the electrode 52 of the client circuit.

Another example for using the sensor device according to the invention is its use in a laundry drier. If a part of the server electrode 50 is in (weak) capacitive coupling with the inside of the drum, a detection of "child in the drum" or a "drum rotation detection" (in case of use of conductive lifters) can take place on the basis of the measurement of the frequency change of the oscillator 10 of the server circuit. At the same time however also a part of the server electrode 50 can be used to operate a client circuit as shown in FIG. 2.

Another example for using the sensor device according to the invention is e.g. integrating the server electrode 50 and one or several client circuits in a car seat for the purpose of a seat occupancy recognition. Here the advantage of the embodiment of the sensor device according to the invention becomes particularly apparent. It is possible to distinguish between a real operation of the client circuit (which leads to an amplitude modulation of the signal) and an increased signal level due to a person sitting on the seat. In the second case, additionally to the signal level change, a particularly great frequency change is also present.

FIG. 3 shows a further advantageous embodiment of the sensor device according to the invention. Here too the server circuit is formed as shown in FIG. 1. The client circuit corresponds substantially also to the client circuit in FIG. 2, with the difference, that the electrode 52 is coupled capacitive against mass. The client circuit is arranged as to the server circuit in such a way that the electric field irradiated on the electrode 50 is coupled on the electrode 51 of the client circuit only when a conductive object, for example a hand, is between the electrode 50 and the electrode 51. The signal radiated on the electrode 50 is transmitted by the object situated between the client circuit and the server circuit from the electrode 50 to the electrode 51 (i.e. the electric field is coupled by the bridging effect of the conductive object at the electrode 51).

Likewise the transmission of the modulated signal by the client circuit or the modulation device 70 via the object arranged between the electrodes takes place. Also in this respect the signal generated by the client circuit is amplitude-modulated.

As already described in FIG. 2, the approach of an object to the server electrode 50 also according to the embodiment in FIG. 3, causes also an absorption of a part of the electric field irradiated from the server electrode 50. The absorption leads here to a frequency change of the oscillator signal. Therefore can be also recognized in this embodiment, in case of corresponding arrangement of the client circuit opposite to the server circuit, as shown e.g. in FIG. 3, the approach of an object to the server electrode 50, still before the object causes a bridging effect for coupling the electric field of the server electrode 50 to the electrode 51.

The evaluating device 40 is formed here in such a way that it can detect and evaluate both the approach of an object to the server electrode 50 (frequency change) and coupling of the electric field on the electrode 51 (amplitude variation).

The server circuit of the sensor device according to the invention thus is formed in such a way, that the server circuit can be used as approaching sensor alone (i.e. without co-operation with a client circuit), but it could be implemented at the same time also a sensor network together with one or several client circuits, whereby the client circuits preferably are fed with energy with the electric field of the server electrode 50. The setting up of a sensor network with a server circuit and several client circuits can take place for example in such a way that the evaluating device of the server circuit can distinguish the single client circuits.

The invention claimed is:

1. A sensor device for detection of an approach of an object in a observation area supervised by the sensor device, comprising:
a server circuit with an LC-oscillating circuit with a signal transducer circuit operable to generate an electric field; a first electrode device coupled with the LC-oscillating circuit, wherein a capacitance of the first electrode device is a component of an oscillator circuit capacitance and wherein the electric field generated by the LC-oscillating circuit via the first electrode device is adapted to be radiated into the observation area; and an evaluating device; wherein the approach of an object in the observation area of the first electrode device causes a change of the capacitive environment of the first electrode device, which is detectable by the evaluating device,
further comprising at least one client circuit with a second electrode device, comprising at least one first electrode and at least one second electrode; and a modulation device coupled with the second electrode device; wherein the electric field radiated by the first electrode device of the server circuit is couplable at the first electrode of the second electrode device, the coupled electric field being modulatable via the modulation device wherein the modulated signal is fed back to the server circuit via the first electrode device of the server circuit and the signal fed back being detectable and evaluatable by the evaluating device.

2. The sensor device according to claim 1 wherein the signal generator circuit comprises an oscillator.

3. The sensor device according to claim 2 wherein the capacitive environment change of the first electrode device causes a frequency change of the free-running LC-oscillator wherein the frequency change is detectable by the evaluating device.

4. The sensor device according to claim 1 wherein the LC-oscillating circuit is a series LC-oscillating circuit and the first electrode device is connected in parallel to the series LC-oscillating circuit.

5. The sensor device according to claim 1 wherein the LC-oscillating circuit is a parallel LC-oscillating circuit and the first electrode device is connected in series to the parallel LC-oscillating circuit.

6. The sensor device according to claim 1 wherein the signal transducer circuit is a generator and a capacitive environment change of the first electrode device causes a signal phase shifting of the generator.

7. The sensor device according to claim 6, wherein the generator is operated in resonance with the LC-oscillating circuit.

8. The sensor device according to claim 1 wherein the approach of an object to the second electrode of the second electrode device causes a modulation of the coupled electric field by the modulation device.

9. The sensor device according to claim 1 wherein coupling of the electric field takes place by bridging and the bridging causes a modulation of the coupled electric field by the modulation device.

10. The sensor device according to claim 1 wherein the modulation device amplitude-modulates the coupled electric field whereby the change of the amplitude is detectable by the evaluating device.

11. The sensor device according to claim 1 wherein the approach of an object in the observation area of the first electrode device of the server circuit is detectable and the approach of the object to the second electrode of the second electrode device is detectable.

12. The sensor device according to claim 1 wherein the approach of an object in the observation area of the first electrode device of the server circuit is detectable before the approach of the object to the second electrode of the second electrode device.

13. The sensor device according to claim 1 wherein the client circuit being supplied with energy by the electric field generated by the server circuit.

14. The sensor device according to claim 1 wherein the first electrode of the second electrode device is formed by the first electrode device of the server circuit.

15. The sensor device according to claim 1, wherein the LC-oscillating circuit is an LC-oscillating circuit having a high quality factor.

16. The sensor device according to claim 1, wherein the modulation device performs a load modulation.

* * * * *